(12) United States Patent
Chuang et al.

(10) Patent No.: US 8,144,529 B2
(45) Date of Patent: Mar. 27, 2012

(54) SYSTEM AND METHOD FOR DELAY LOCKED LOOP RELOCK MODE

(75) Inventors: Hsiao-Ching Chuang, Santa Clara, CA (US); Martin Aaron, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 357 days.

(21) Appl. No.: 12/415,971

(22) Filed: Mar. 31, 2009

(65) Prior Publication Data

US 2010/0246294 A1   Sep. 30, 2010

(51) Int. Cl.
*G11C 7/00* (2006.01)
(52) U.S. Cl. ............... 365/194; 365/233.1; 365/233.12; 365/233.11
(58) Field of Classification Search ................ 365/194, 365/233.1, 233.12, 233.11
See application file for complete search history.

(56) References Cited

U.S. PATENT DOCUMENTS

| 2002/0140471 A1* | 10/2002 | Fiscus | 327/158 |
| 2005/0077937 A1* | 4/2005 | Meyer | 327/158 |
| 2007/0063748 A1* | 3/2007 | Chung | 327/158 |
| 2007/0152723 A1* | 7/2007 | Ahn et al. | 327/158 |

OTHER PUBLICATIONS

"Search and Examination Report for Great Britain Patent Application No. 1005164.7", (Aug. 26, 2010), Whole Document.

* cited by examiner

*Primary Examiner* — Vu Le
*Assistant Examiner* — Han Yang
(74) *Attorney, Agent, or Firm* — Blakely, Sokoloff, Taylor & Zafman LLP

(57) ABSTRACT

Embodiments of the present invention describe a memory device comprising a delay line and a feedback circuit coupled to the delay line. The feedback circuit has the capability to adjust a delay interval, which is then locked on the delay line. The feedback circuit is switched off after the delay interval is locked to reduce power consumption. The feedback circuit periodically switches on to adjust and lock the delay interval.

18 Claims, 3 Drawing Sheets

US 8,144,529 B2

SYSTEM AND METHOD FOR DELAY LOCKED LOOP RELOCK MODE

BACKGROUND

1. Field

One or more embodiments of the present invention relate to the field of memory devices and more particularly to a system and method for controlling a delay locked loop (DLL) in a dynamic random access memory (DRAM) device.

2. Discussion of Related Art

In high performance digital systems, the timing synchronization between various electronic devices is an important design criteria for maintaining system performance. For example, the output of a memory device has to be synchronized to the system clock in order to prevent operation errors and delays that affect the overall system performance.

The memory device, in particular a dynamic random access memory (DRAM) device, implements a delay locked loop (DLL) that synchronizes the DRAM output to the system clock. The DLL monitors the system clock signal received by the DRAM device and synchronizes its output clock signal to the system clock signal so as to ensure that the data output from the DRAM device is synchronized to the system clock. Typically, the DLL comprises a feedback loop that monitors an input clock signal, which is usually the system clock, and adjusts its output clock signal to be in phase to the input clock signal.

For the DRAM, the DLL helps to control the read return timing and on-die termination (ODT) operations. Hence, the DLL improves the bus turnaround time and the overall system performance. However, during the operation of the DRAM, the DLL constantly receives power in order to maintain synchronization between DRAM output and the system clock. Thus, the DLL contributes to the extensive power consumption by the DRAM that also requires constant power to maintain data content. A memory developer could implement a DLL-off mode to bypass the whole DLL in order to save power but this would result in asynchronous timing between the read return timing and ODT.

DETAILED DESCRIPTION

In the following description, numerous specific details are set forth in order to provide a thorough understanding of one or more embodiments of the present invention. In other instances, well known memory device functionality and features have not been described in particular detail in order not to unnecessarily obscure this detailed description.

Embodiments of the present invention include a memory device comprising a delay locked loop (DLL) circuit. The DLL circuit comprises a delay line to receive an input clock signal and to generate an output clock signal. A feedback circuit is coupled to the delay line. The feedback circuit has the capability to adjust a delay interval to align the clock phase of the output clock signal to the clock phase of the input clock signal. The delay interval is to be locked onto the delay line. Once the delay interval is locked, the feedback circuit is to be switched off. By switching off the feedback circuit and keeping the delay line on, the power consumption is reduced without affecting the synchronization of the input and output clock signals. Subsequently, the feedback circuit is to switch on periodically to align the clock phase of the output clock signal to the input clock signal based on the previously locked delay interval. By periodically switching on the feedback circuit, the DLL circuit prevents phase deviation between the input and output clock signals.

Figure 1:
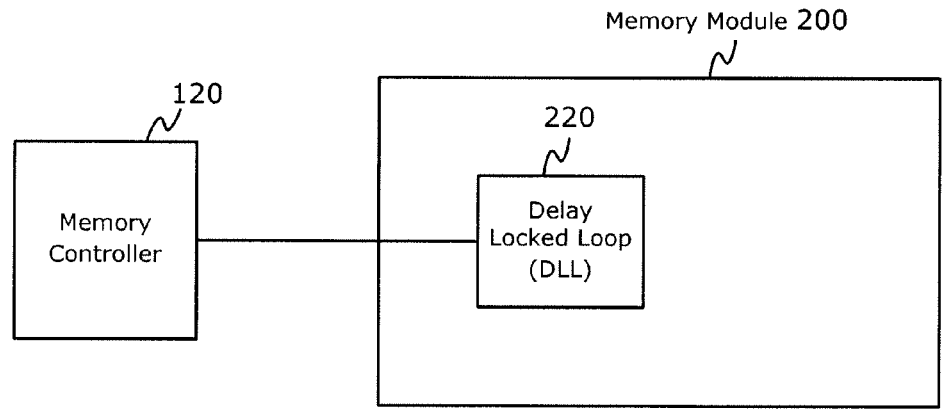
FIG. 1 is a block diagram that illustrates a system comprising a delay locked loop in accordance with one embodiment of the present invention.

FIG. 1 illustrates a system for controlling a memory module. In an embodiment of the present invention, the system comprises a memory controller 120 coupled to a memory module 200. The memory module 200 comprises a delay locked loop (DLL) 220 coupled to the memory controller 120. In an embodiment of the present invention, the memory module 200 is a dynamic random access memory (DRAM) module. In a particular embodiment, the memory module 200 is a double-data-rate (DDR) DRAM module, such as but not limited to DDR3 DRAM or DDR4 DRAM.

Figure 2:
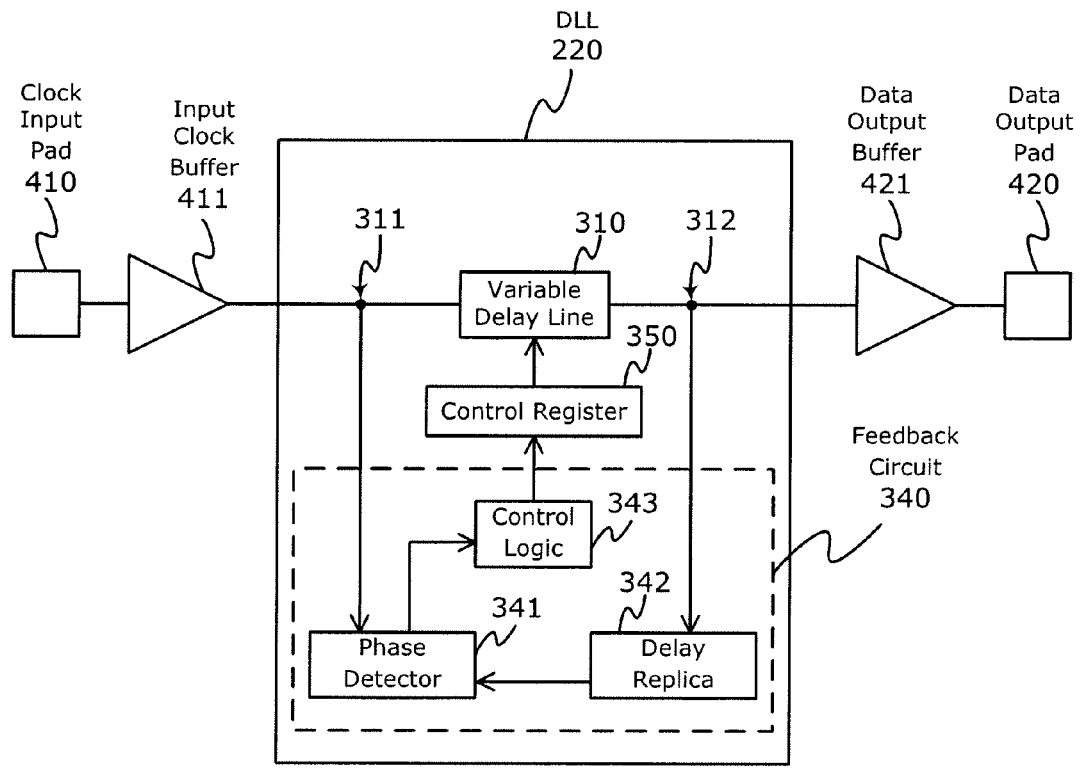
FIG. 2 is a block diagram that illustrates a delay locked loop in accordance with one embodiment of the present invention

FIG. 2 illustrates the DLL 220 in accordance with one embodiment of the present invention. The DLL 220 is coupled to a clock input pad 410 and a data output pad 420. In one embodiment, the clock input pad 410 is coupled to a system clock pad (not shown) to receive a system clock signal. In one embodiment, the data output 420 is coupled to a data strobe (DQS) pad (not shown).

The DLL 220 comprises a delay line 310 coupled to the clock input pad 410 and the data output pad 420. In one embodiment, the delay line 310 comprises an input 311 to receive an input clock signal, and an output 312 to generate an output clock signal. In one embodiment, the delay line 310 is a digitally controlled variable delay line. In one embodiment, an input clock buffer 411 is coupled between the clock input pad 410 and the input 311 of the delay line 310. The input clock buffer 411 receives a system clock signal from the clock input pad 410 and generates an input clock signal to the delay line 310. Additionally, a data output buffer 421 is coupled between the output 312 of the delay line 310 and the data output pad 420.

In one embodiment, the DLL 220 further comprises a feedback circuit 340 coupled to the delay line 310. The feedback circuit 340 has the capability to adjust a delay interval for aligning the clock phase of the output clock signal generated by delay line 310 to the clock phase of the input clock signal received by the delay line 310. The delay interval is then locked onto the delay line 310. In an embodiment of the present invention, the feedback circuit 340 comprises a phase detector 341 coupled to the delay line 310. In one embodiment, the phase detector 341 is coupled to the input 311 and the output 312 of the delay line 310 to detect the phase difference between the input clock signal at input 311 and the output clock signal at output 312. The phase detector then generates a phase output signal according to the phase difference between the input clock signal and the output clock signal. In one embodiment, a delay replica 342 is coupled between the phase detector 341 and the output 312 of the delay line 310.

In one embodiment, the feedback circuit 340 further comprises a control logic 343 coupled to the phase detector 341. The control logic 343 receives the phase output signal from the phase detector 341 and generates a control signal according to the phase output signal. The control signal generated by the control logic 343 corresponds to a delay interval that aligns the clock phase of the output clock signal to the clock phase of the input clock signal.

In an embodiment of the present invention, the DLL 220 further comprises a control register 350 coupled to the delay line 310 and the control logic 343. The control register 350 receives the control signal generated by the control logic 343 and stores a control value corresponding to the delay interval. In other words, the delay interval is now "locked" onto the delay line 310.

In a conventional DRAM module, the entire DLL constantly receives power in order to adjust and lock the delay interval so as to synchronize the DRAM output to the system clock. In particular, the typical DLL constantly receives power when the DRAM is in operational mode. Operational mode refers to a powered on DRAM performing operations such as but not limited to a read operation, for example the reading of data from the memory bank of the DRAM, or a write operation, such as writing of data into the memory bank. In addition, the operational mode also includes an idle mode where the DRAM is waiting for commands to read or write data into the memory bank. In an embodiment of the present invention, the feedback circuit 340 is powered on to adjust and lock the delay interval only when commanded by the memory controller 120. When the memory module 200 is in operational mode, the feedback circuit 340 adjusts and locks the delay interval to the delay line 310. Once the delay interval is locked, the feedback circuit 340 is powered down to reduce power consumption. In one embodiment, the phase detector 341, delay replica 342 and control logic 343 are powered down. Furthermore, when the feedback circuit 340 is powered down or switched off, the delay line 310 remains powered on with the delay interval from the previous feedback circuit 340 update. Subsequently, the feedback circuit 340 is powered on periodically to adjust or lock the delay interval onto the delay line 310. In one embodiment, the DLL 220 operations are separated from the read or write operations of the memory module 200. In other words, the powering on or powering off operations of the feedback circuit 340 is independent of the read or write operations of the memory module 200.

In an embodiment of the present invention, the memory controller 120 is coupled to the DLL 220 to control the operations of the DLL 220. In one embodiment, the memory controller 120 switches off the entire feedback circuit 340 after the delay interval is locked without switching off the delay line 310. In order to maintain timing synchronization, the memory controller 120 periodically switches on the feedback circuit 340 to re-align the clock phase of the input clock signal at the input 311 to the clock phase of the output clock signal at output 312. In an embodiment of the present invention, the memory controller 120 comprises a scheduler module (not shown) that determines periodic intervals for switching on the feedback circuit 340.

Figure 3:
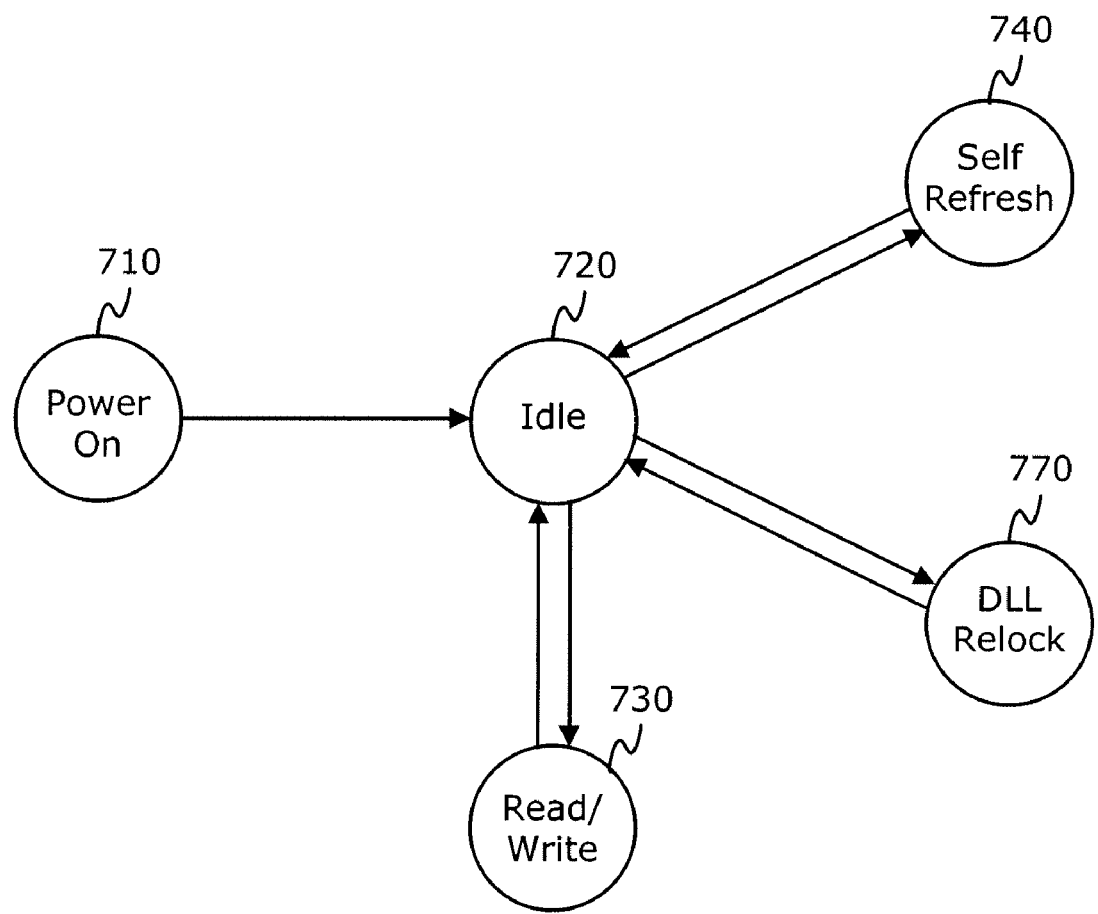
FIG. 3 is a simplified state diagram that illustrates the state transitions of a memory module in accordance with one embodiment of the present invention.

FIG. 3 illustrates a simplified state diagram showing the state transitions of the memory module 200 in accordance with one embodiment of the present invention. In the Power On state 710, power is applied to the memory module 200. When the memory module is powered on, it undergoes initialization and calibration before it proceeds into an idle mode shown as the Idle state 720.

From the Idle state 720, the memory module 220 can transit to a Read/Write state 730 when it receives a read or write command. At the Read/Write state 730, the memory module 220 is performing read or write operations. In an embodiment of the present invention, the memory module 200 comprises a memory bank (not shown) coupled to the DLL 220. During the read or write operations, the memory bank is either receiving, storing or outputting data. After the read or write operations are completed, the memory module 220 returns to the Idle state 720. At the Idle state 720, the memory bank is neither reading nor writing data. In other words, the memory bank is waiting for commands to receive, store or output data.

At the Power On state 710, the DLL 220 is initialized to lock a delay interval so that the read return timing of the memory module 200 is aligned to the system clock. In other words, the entire DLL 220 is powered on so that the feedback circuit 340 can adjust a delay interval for aligning the clock phase of the output clock signal generated by delay line 310 to the clock phase of the input clock signal received by the delay line 310. The delay interval is then locked onto the delay line 310. Once the delay interval has been locked, the feedback circuit 340 is powered down to reduce power consumption of the memory module 200.

When the feedback circuit 340 is powered down, the delay line 310 remains powered on with the locked delay interval. By keeping the delay line 310 powered on, the DLL 220 remembers the previously locked delay interval so as to power on or power down fast. Additionally, by keeping the delay line 310 powered on, it enables the memory module 200 to achieve synchronous timing even though the feedback circuit 340 is powered down.

Subsequently, the feedback circuit 340 is powered on at periodic intervals based on the previously locked delay interval to re-align the clock phase of the output clock signal to the clock phase of the input clock signal. In one embodiment, the periodic interval is about 10 clock cycles. In the event that there is no phase deviation between the output clock signal and the input clock signal, the DLL 220 "relocks" the previously locked delay interval to the delay line 310. On the other hand, if there is a phase deviation between the output clock signal and the input clock signal, the DLL 200 adjusts the delay interval and locks the adjusted delay interval to the delay line 310.

In an embodiment of the present invention, the memory module 200 can transit from the Idle state 720 to a DLL Relock state 770 as shown in FIG. 3. At the DLL Relock state 770, the memory module 200 receives a DLL relock command from memory controller 120 to switch on the feedback circuit 340 and align the clock phase of the output clock signal to the clock phase of the input clock signal. In one embodiment, when the feedback circuit 340 is powered on, the DLL 220 uses the previously locked delay interval to align the clock phase of the output clock signal to the input clock signal. However, due to a voltage or temperature drift, the read return timing may deviate from the system clock signal. In this case, the DLL 220 adjusts the delay interval so that the clock phase of the output clock signal is re-aligned to the input clock signal before locking the adjusted delay interval onto the delay line 310. Thus, in the DLL Relock state 770, the feedback circuit 340 can be periodically powered on to correct any phase deviation between the input clock signal and the output clock signal. In one embodiment, a developer has the flexibility to define the degree of timing synchronization by varying the frequency of executing the DLL relock command.

By performing periodical relock of the delay interval, the DLL 220 overcomes a main performance concern in a typical DDR3 DLL-off mode, where the ODT and read return timing are asynchronous because DRAM developers could implement the DLL-off mode by bypassing the whole DLL to save delay line power or because the implementation does not allow locking the delay interval to variable delay line while the feedback loop is off.

In an alternative embodiment, a temperature sensing mechanism can be implemented to detect any significant temperature change of the memory module 200. If the detected temperature exceeds a desired level, there might be a voltage or temperature drift causing phase deviation. The memory controller 120 will then transmit a DLL relock command to switch on the feedback circuit 340 and correct any phase deviation.

In an embodiment of the present invention, the memory module 200 can transit from the Read/Write state 730 to the DLL Relock state 770. In an embodiment of the present invention, during a read or write operation, the feedback circuit 340 is powered on based on the previously locked delay interval to align the clock phase of the output clock signal to the input clock signal. Similarly, once the feedback circuit 340 is powered on, the previously locked delay interval is locked to the delay line 310 if there is no phase deviation between the output clock signal and the input clock signal. Alternatively, if there is a phase deviation, the DLL 220 adjusts the delay interval so that the clock phase of the output clock signal is re-aligned to the input clock signal before locking the adjusted delay interval onto the delay line 310. In another embodiment, the feedback circuit 340 is powered on before a read/write operation is initiated or after a read/write operation is completed.

From the Idle state 720, the memory module 200 can also transition to a Self Refresh state 740. In an embodiment of the present invention, the memory module 220 is forced into the DLL Relock state 770 after exiting from the Self Refresh state 740. In other words, the memory controller 120 sends a DLL relock command to the memory module 200 when the memory module 200 exists from a Self Refresh state 740 to switch on the feedback circuit 340. Once the feedback circuit 340 is switched on, the DLL 220 relocks the previously locked delay interval. If there is phase deviation, the DLL 220 adjusts the delay interval and locks the delay interval.

It can be appreciated that FIG. 3 is a simplified state diagram of the memory module 200 and certain well known operations such as reset procedure, ZQ calibration, bank active, precharging, active power, precharge power down are not shown for simplicity purpose.

Figure 4:
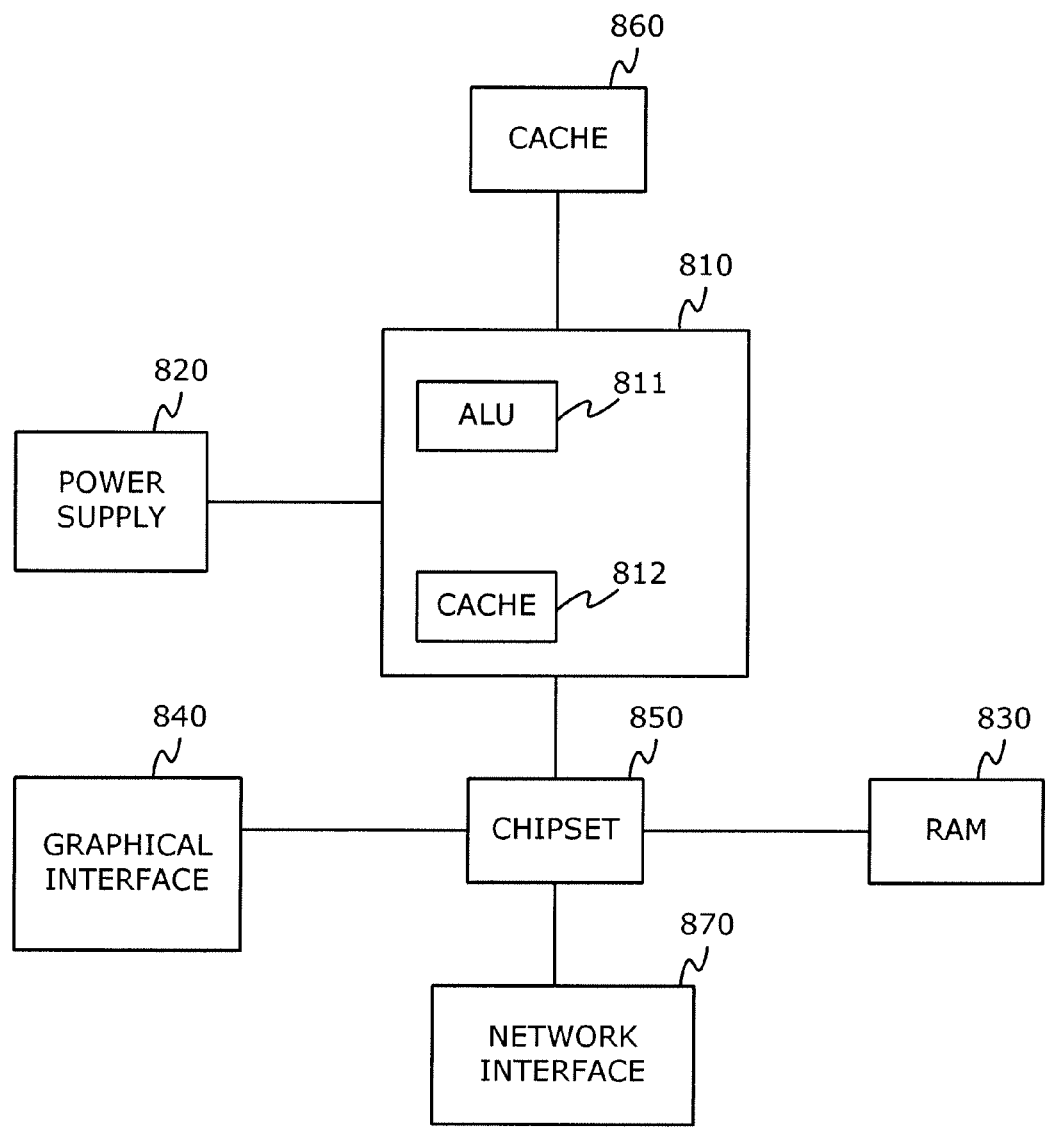
FIG. 4 is a block diagram that illustrates a processing system in which one embodiment of the invention may be used.

FIG. 4 illustrates a processing system comprising a processor 810, a power supply 820, and a random access memory (RAM) 830. In one embodiment, the processor 810 includes an arithmetic logic unit 811 and an internal cache 812. The processing system further comprises a graphical interface 840, a chipset 850, a cache 860, and a network interface 870. In one embodiment, the processor 810 can be a microprocessor or any type of processor. If the processor 810 is a microprocessor, it may be included on a chip die with all or combinations of the remaining features, or one or more of the remaining features may be electrically coupled to the microprocessor die through known connections and interfaces. In FIG. 4, one or more embodiments of the DLL 220 may be implemented in the RAM 830 to, for example, reduce power consumption of the RAM 830. In one embodiment, the memory controller 120 may be implemented in the chipset 850.

Embodiments of the invention may be implemented in a variety of electronic devices and logic circuits. Furthermore, devices or circuits that include embodiments of the invention may be included within a variety of computer systems, including a point-to-point (p2p) computer system and shared bus computer systems. Embodiments of the invention may also be included in other computer system topologies and architectures.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A memory device comprising:
 a delay locked loop (DLL) circuit comprising:
  a delay line to receive an input clock signal and to generate an output clock signal; and
  a feedback circuit coupled to the delay line, the feedback circuit comprising:
   a phase detector coupled to the delay line to detect a phase difference between the input clock signal and the output clock signal and to generate a phase output corresponding to the phase difference; and
   a control logic coupled to the phase detector and the delay line to receive the phase output from the phase detector and to generate a control signal corresponding to the phase output,
  wherein the feedback circuit is to adjust a delay interval with the control signal to align the clock phase of the output clock signal to the clock phase of the input clock signal, and wherein the adjusted delay interval is to be locked onto the delay line; and
 wherein the entire feedback circuit is to be powered down after the delay interval is locked onto the delay line, and wherein the feedback circuit is to be powered on to re-align the clock phase of the output clock signal to the clock phase of the input clock signal.

2. The memory device of claim 1, further comprising:
 a memory bank coupled to the DLL circuit, and
 wherein the feedback circuit is to be powered on when the memory bank is to receive, store or output data.

3. The memory device of claim 2, wherein the feedback circuit is to be powered on when the memory bank is waiting to receive, store or output data.

4. The memory device of claim 1, further comprising:
 a control register coupled to the control logic and the delay line, wherein the control register is to receive the control signal generated by the control logic and is to store a control value corresponding to the delay interval.

5. The memory device of claim 1, wherein the delay line is not to switch off when the feedback circuit is powered down after the delay interval is locked onto the delay line.

6. The memory device of claim 1, wherein the feedback circuit is to adjust the delay interval locked onto the delay line when the feedback circuit is powered on.

7. A system comprising:
 a memory device comprising:
  a delay locked loop (DLL) circuit comprising:
   a delay line to receive an input clock signal and to generate an output clock signal; and
   a feedback circuit coupled to the delay line, the feedback circuit comprising:
    a phase detector coupled to the delay line to detect a phase difference between the input clock signal and the output clock signal and to generate a phase output corresponding to the phase difference; and
    a control logic coupled to the phase detector and the delay line to receive the phase output from the phase detector and to generate a control signal corresponding to the phase output, wherein the feedback circuit is to adjust a delay interval with the control signal to align the clock phase of the output clock signal to the clock phase of the input clock signal, and wherein the adjusted delay interval is to be locked onto the delay line; and a memory controller coupled to the DLL circuit, wherein the memory controller is to power down the feedback circuit after the delay interval is locked onto the delay line, and wherein the memory controller is to power on the feedback circuit to re-align the clock phase of the output clock signal to the clock phase of the input clock signal.

8. The system of claim 7, wherein the memory controller is not to switch off the delay line when the feedback circuit is to be powered down.

9. The system of claim 7, wherein the feedback circuit is to adjust the delay interval when the memory controller is to power on the feedback circuit.

10. The system of claim 7, further comprising:
a temperature sensor coupled to the memory device to detect temperature change of the memory device; and
wherein the memory controller is to power on the feedback circuit according to the detected temperature change to adjust the delay interval.

11. The system of claim 7, wherein the memory controller comprises a scheduler to determine a periodic interval to power on the feedback circuit.

12. The system of claim 7, the memory device further comprising:
a memory bank coupled to the DLL circuit, and wherein the feedback circuit is to be powered on when the memory bank is to receive, store or output data.

13. The system of claim 12, wherein the feedback circuit is to be powered on when the memory bank is waiting to receive, store or output data.

14. A method of controlling a memory device, comprising:
with a phase detector of a feedback circuit:
detecting a phase difference between an input clock signal and an output clock signal, wherein the feedback circuit is coupled to a delay line and the delay line receives the input clock signal and generates the output clock signal; and
generating a phase output corresponding to the phase difference;
with control logic of the feedback circuit:
receiving the phase output from the phase detector; and
generating a control signal corresponding to the phase output;
with the control signal, the feedback circuit adjusting a delay interval to align a clock phase of the output clock signal to a clock phase of the input clock signal;
locking the adjusted delay interval on the delay line;
powering down the entire feedback circuit after locking the delay interval; and
powering up the feedback circuit in periodic intervals to align the clock phase of the output clock signal to the clock phase of the input clock signal using the delay interval locked on the delay line.

15. The method of claim 14, wherein powering down the entire feedback circuit after locking the delay interval by the feedback circuit does not include powering down the delay line.

16. The method of claim 14, further comprising:
detecting a temperature change of the memory device; and
powering up the feedback circuit according to the detected temperature to adjust the delay interval.

17. The method of claim 14, further comprising:
coupling a memory bank to the delay line, the memory bank receiving, storing and outputting data;
wherein powering up the feedback circuit in periodic intervals to relock the delay interval is performed when the memory bank is receiving, storing and outputting data.

18. The method of claim 17, wherein powering up the feedback circuit in periodic intervals to relock the delay interval is performed when the memory bank is waiting to receive, store and output data.

* * * * *